United States Patent
Campbell

(10) Patent No.: US 7,140,105 B2
(45) Date of Patent: Nov. 28, 2006

(54) METHOD OF FABRICATING A NOTCHED ELECTRICAL TEST PROBE TIP

(75) Inventor: Julie A. Campbell, Beaverton, OR (US)

(73) Assignee: LeCroy Corporation, Chestnut Ridge, NY (US)

( * ) Notice: Subject to any disclaimer, the term of this patent is extended or adjusted under 35 U.S.C. 154(b) by 0 days.

(21) Appl. No.: 10/971,344

(22) Filed: Oct. 22, 2004

(65) Prior Publication Data

US 2005/0052193 A1 Mar. 10, 2005

Related U.S. Application Data

(62) Division of application No. 10/364,017, filed on Feb. 10, 2003, now Pat. No. 6,809,535, which is a division of application No. 09/629,018, filed on Jul. 31, 2000, now Pat. No. 6,538,424.

(51) Int. Cl.
 H01R 43/00 (2006.01)
 H01R 43/16 (2006.01)

(52) U.S. Cl. ............ 29/874; 29/884; 324/158.1

(58) Field of Classification Search ............ 324/158.1; 29/874, 854, 885, 857, 592, 592.1, 861–866, 29/825; 439/207–211, 55
See application file for complete search history.

(56) References Cited

U.S. PATENT DOCUMENTS

| 103,330 | A | | 5/1870 | Heusser | |
|---|---|---|---|---|---|
| 1,277,454 | A | | 9/1918 | Mess | |
| 3,609,539 | A | | 9/1971 | Gunthert | |
| 3,880,745 | A | * | 4/1975 | Shaw | 204/290.05 |
| 3,916,518 | A | * | 11/1975 | Jones et al. | 29/877 |
| 4,001,679 | A | | 1/1977 | Cargile et al. | |
| 4,002,518 | A | * | 1/1977 | Shaw | 156/154 |
| 4,189,203 | A | * | 2/1980 | Miller | 439/263 |
| 4,199,833 | A | | 4/1980 | Sitkins et al. | |
| 4,417,206 | A | | 11/1983 | Stowers | |
| 4,423,373 | A | | 12/1983 | LeCroy, Jr. | |
| 4,680,542 | A | | 7/1987 | Krupp | |
| 4,686,465 | A | | 8/1987 | Kruger | |
| 4,767,985 | A | | 8/1988 | Shearer, Jr. et al. | |
| 4,783,624 | A | | 11/1988 | Sabin | |
| 5,032,787 | A | | 7/1991 | Johnston et al. | |
| 5,105,148 | A | | 4/1992 | Lee | |
| 5,170,788 | A | * | 12/1992 | Blumenfeld | 600/372 |
| 5,184,065 | A | | 2/1993 | Chism | |
| 5,190,548 | A | * | 3/1993 | Davis | 606/80 |
| 5,457,392 | A | | 10/1995 | Filipescu | |
| 5,557,213 | A | | 9/1996 | Reuter et al. | |
| 5,667,410 | A | | 9/1997 | Johnston | |

(Continued)

*Primary Examiner*—Paresh Patel
(74) *Attorney, Agent, or Firm*—Law Office of Karen Dana Oster, LLC

(57) ABSTRACT

A method of fabricating a notched electrical test probe tip preferably includes the first step of providing an elongate electrically conductive blank having a longitudinal planar axis, a first end, and a second end opposite the first end. Preferably, the next step is drilling a central bore substantially parallel to the longitudinal planar axis, the central bore extending at least partially from the first end to the second end. Then, preferably, at least one portion of the blank is removed from the longitudinal planar axis at the first end to an exterior surface of the blank between the first end and the second end to expose a contact surface. In one preferred embodiment, the method may include a step of coating the exterior surface of the blank with insulation.

20 Claims, 3 Drawing Sheets

U.S. PATENT DOCUMENTS

| | | |
|---|---|---|
| 5,731,710 A | 3/1998 | Mizuno et al. |
| D400,811 S | 11/1998 | Swart et al. |
| 5,895,403 A * | 4/1999 | Collinsworth ............... 606/184 |
| 5,915,759 A * | 6/1999 | Logerot et al. ............... 29/874 |
| D422,518 S | 4/2000 | Luebke |
| 6,118,287 A * | 9/2000 | Boll et al. .................. 324/754 |
| 6,168,593 B1 * | 1/2001 | Sharkey et al. ............... 606/34 |
| 6,208,155 B1 * | 3/2001 | Barabi et al. ............... 324/754 |
| 6,271,672 B1 | 8/2001 | Swart et al. |
| 6,407,562 B1 * | 6/2002 | Whiteman .................. 324/754 |
| 6,538,424 B1 | 3/2003 | Campbell |

\* cited by examiner

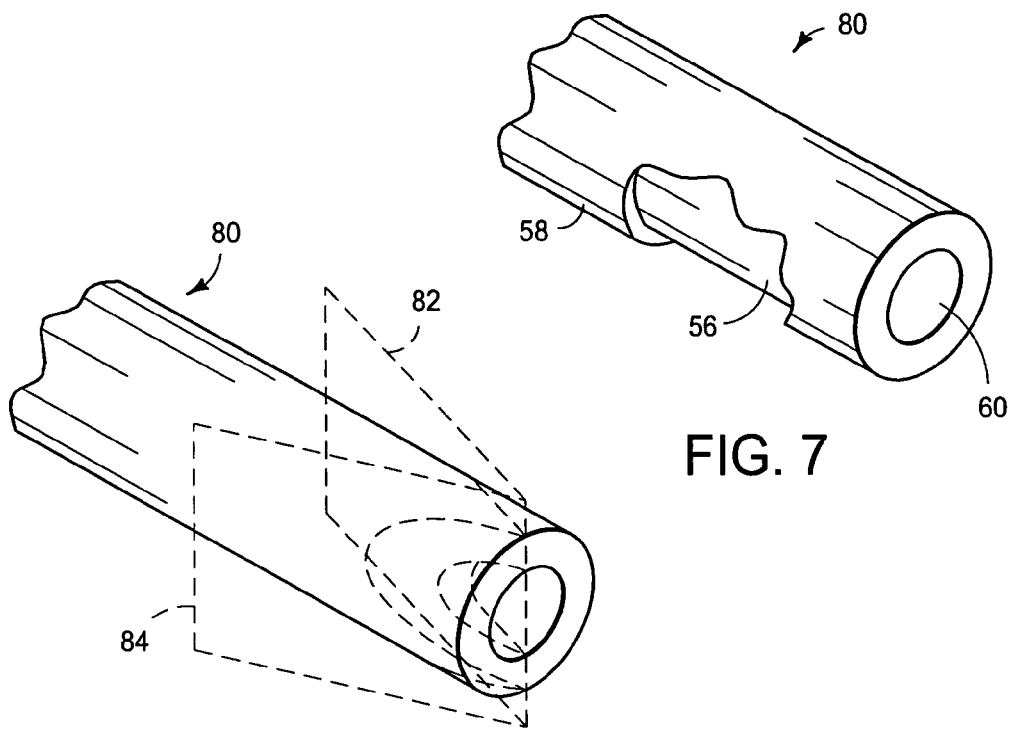
FIG. 7
FIG. 8
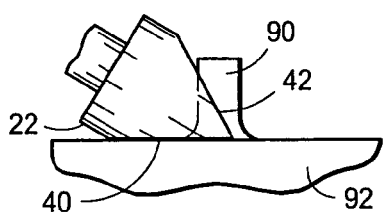
FIG. 9
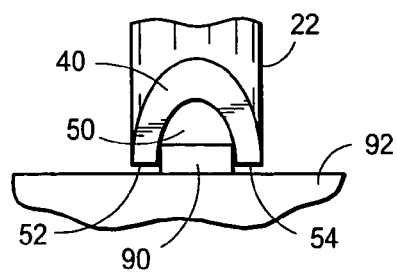
FIG. 10
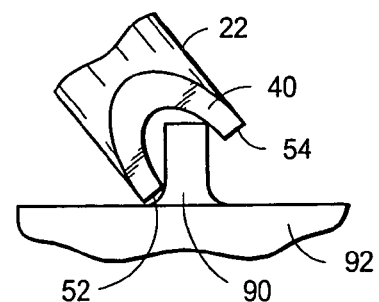
FIG. 11

METHOD OF FABRICATING A NOTCHED ELECTRICAL TEST PROBE TIP

The present application is a divisional of U.S. patent application Ser. No. 10/364,017, filed Feb. 10, 2003, now U.S. Pat. No. 6,809,535, which in turn is a divisional of U.S. patent application Ser. No. 09/629,018, filed Jul. 31, 2000, now U.S. Pat. No. 6,538,424. The present application is based on and claims priority from these applications, the disclosures of which are hereby incorporated herein by reference.

BACKGROUND OF THE INVENTION

The present invention relates to an electrical test probe tip capable of establishing an electrical connection to test objects on a circuit board and particularly to rounded or irregularly shaped test objects.

Typical modern circuit boards tend to include a variety of components (hereinafter referred to generally as "circuit board components"). For example, most circuit boards will include one or more integrated circuits with a set of leads, legs, or pins (hereinafter referred to as "leads") on both sides of a package. There are also many rounded or irregularly shaped devices such as ceramic resistors, capacitors, through hole pins. Circuit board components such as those described above often need to be monitored or tested by testing instruments such as oscilloscopes and other measuring, monitoring, diagnostic, and signal processing instruments.

Electronic test probes are used to provide an electrical connection between circuit board components and testing instruments. An electronic test probe generally consists of a probing head, a cable, and a connector. The probing head may have an integral or replaceable probing tip that is suitable for making an electronic contact with electrical components. The probing head is attached to a first end of the cable and the connector is attached to the opposite end of the cable.

As shown in FIG. 1, a conventional test probe tip is generally in the shape of a cone that narrows, similar to the point of a pencil, becoming a sharp point or slightly blunt point. Test probe tips are usually made out of conductive metal such as copper, beryllium copper, nickel-palladium alloy, metal alloy, aluminum, steel, or a similar conductive metal.

Test probes that are used manually require an operator to hold the test probe tip against the circuit board components. Conventional test probe tips having a single point can easily slip off circuit board components, especially rounded or irregularly shaped ones. After slipping off a circuit board component, the exposed conductive material on a conventional test probe tip may, for example, contact two leads at the same time, cause an electrical short, and possibly damage the component.

Approaches have been taken in the past to solve the problems of a conventional test probe tip slipping and contacting two leads at the same time, causing an electrical short.

U.S. Pat. No. 4,783,624 to Sabin (the "Sabin reference") sets forth a contact probe device and, as an example of an alternative to common conical pointed tips, a test probe tip with a "V" cut. As shown in the Sabin reference, the wide portion of the V starts from the outer periphery of the first end of the tip and the narrow portion of the V meets at the center longitudinal planar axis toward the second end. The Sabin contact tip essentially creates two contact points instead of one. These points are unsteady and would tend to slip almost as easily as a single tip. This is a particular problem created with testing rounded or irregularly shaped leads or circuit board components. Further, the Sabin contact tip's design requires that most or all of the tip be exposed conductive material in order to establish good electrical contact with the contact points. The amount of exposed conductive material increases the chance for a short to occur. Finally, the probe tip with a "V" cut would be difficult to create and expensive to produce.

U.S. Pat. No. 5,731,710 to Mizuno et al. sets forth several test probe tips (the "Mizuno tips") that have sharp edges particularly suited for breaking through a surface of a test member so as to establish an electrical connection. In several of the embodiments, a plurality of slits extends radially and axially from a top center of the tip. Although the slitted embodiments of the Mizuno tips would be well suited to probing through hole pins, they would be poorly suited to probing components that are rounded or irregularly shaped. Further, the Mizuno tips appear to have an exterior surface that is exposed conductive material and, therefore, would increase the chance for a short to occur. Finally, the Mizuno slitted tips would be difficult to create and expensive to produce.

U.S. Pat. No. 5,557,213 to Reuter et al. sets forth a spring-loaded electrical contact probe having a tip that has a locking attachment that includes at least one slot and at least one flange. The primary purpose of the slot and flange appear to relate to the locking feature of the locking attachment.

BRIEF SUMMARY OF THE INVENTION

The present invention is directed to a method of fabricating a notched electrical test probe tip. The method preferably includes the first step of providing an elongate electrically conductive blank having a longitudinal planar axis, a first end, and a second end opposite the first end. Preferably, the next step is drilling a central bore substantially parallel to the longitudinal planar axis, the central bore extending at least partially from the first end to the second end. Then, preferably, at least one portion of the blank is removed from the longitudinal planar axis at the first end to an exterior surface of the blank between the first end and the second end to expose a contact surface.

In one preferred embodiment, the method may include a step of coating the exterior surface of the blank with insulation prior to the step of drilling a central bore.

The foregoing and other objectives, features, and advantages of the invention will be more readily understood upon consideration of the following detailed description of the invention, taken in conjunction with the accompanying drawings.

BRIEF DESCRIPTION OF THE SEVERAL VIEWS OF THE DRAWING

FIG. 7 is an enlarged perspective view of a blank having a cylindrical bore and an exterior insulation coating.

FIG. 8 is a perspective view of the blank of FIG. 7 cylindrical notched electrical test probe tip with a graphical representation of the modification to be made to create the preferred embodiment of FIG. 2.

FIG. 9 is a side view of notched electrical test probe tip contacting a through hole pin using a sliding method.

FIG. 10 is a front view of notched electrical test probe tip contacting a circuit board component using a perpendicular method.

FIG. 11 is a side view of notched electrical test probe tip contacting a through hole pin using an angled method.

DETAILED DESCRIPTION OF THE INVENTION

The present invention is directed to a method for making a notched electrical test probe tip and a method for using the notched electrical test probe tip. The notched electrical test probe tip is an electrical test probe tip capable of establishing an electrical connection to test objects on a circuit board and particularly to rounded or irregularly shaped test objects. The notched electrical test probe tip is particularly suited for use on bigger IC leads, chip resistors (for example 0402 packages), and chip capacitors (for example, 0201 packages), smaller pins, and square pins. A preferred embodiment of the notched electrical test probe tip of the present invention has a probing tip with a longitudinal planar axis. Two planar contact surfaces substantially form an inverted "V" from the longitudinal planar axis when viewed from either side of the probing tip. The probing tip has a notch defined therein when viewed from both the front and the back. This configuration can be constructed by starting with an elongate electrically conductive blank and drilling an at least partial central bore substantially parallel to the longitudinal planar axis. Then two planar cuts are made removing a portion of the blank to expose the contact surfaces. Optionally the preferred embodiment may have an exterior insulating coating.

As mentioned, the present invention relates to notched electrical test probe tips capable of contacting circuit board components, even those that are rounded or irregularly shaped, without slipping and causing shorts.

Figure 1:
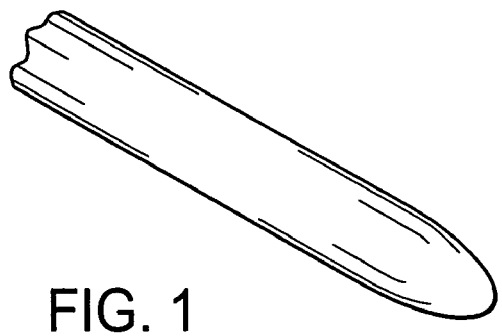
FIG. 1 is an enlarged perspective view of an exemplary prior art electrical test probe tip.
Figure 2:
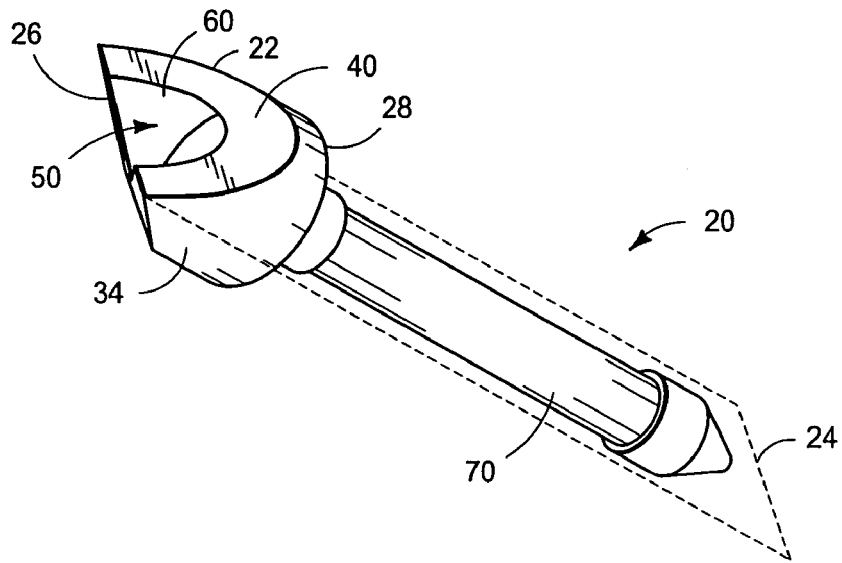
FIG. 2 is an enlarged perspective view of one preferred embodiment of a notched electrical test probe tip of the present invention.
Figure 3:
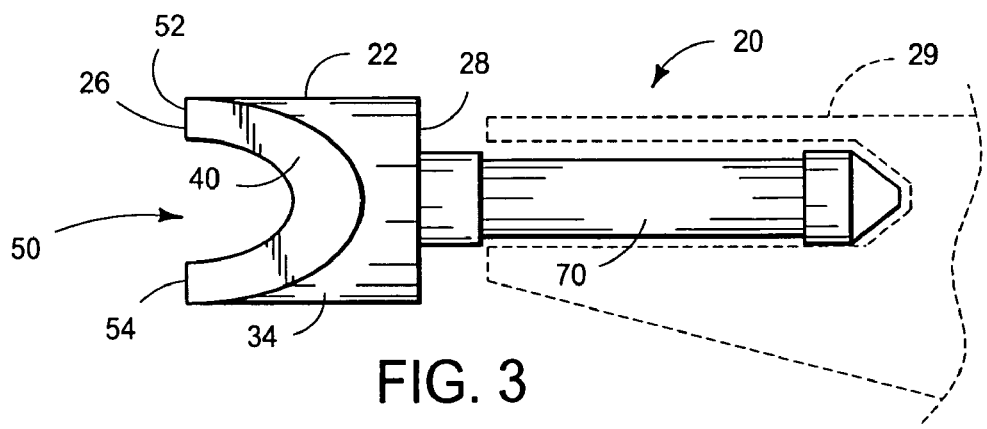
FIG. 3 is a front view of the notched electrical test probe tip of FIG. 2, the back view being a mirror image thereof.

FIGS. 2–6 show several views of one preferred embodiment of a notched electrical test probe tip 20 of the present invention. The shown notched electrical test probe tip 20 has a probing tip 22 having a longitudinal planar axis 24 extending from a first tip end 26 of the probing tip 22 to a second base end 28. The tip end 26 is suitable for coupling with electrical components and the base end 28 is suitable for electrically coupling with an electrical test probe 29. As shown, the longitudinal planar axis 24 divides the probing tip 22 into front and back sections 30, 32. A first planar contact surface 40 extends from the longitudinal planar axis 24 at the tip end 26 to the exterior surface 34 between the tip end 26 and the base end 28. A second planar contact surface 42 extends from the longitudinal planar axis 24 at the tip end 26 to the exterior surface 34 between the tip end 26 and the base end 28. As shown, in FIG. 4, in this embodiment the first and second planar contact surfaces 40, 42 substantially form an inverted "V" when viewed from either side of the probing tip 22. As shown in FIG. 3, in this embodiment the probing tip 22 has a notch 50 defined therein when viewed from both the front and the back. In this shown embodiment, the notch 50 divides the apex where the two planar contact surfaces 40, 42 meet into two contact points 52, 54.

In FIG. 2, the longitudinal planar axis 24 is shown as symmetrically dividing the probing tip 22 into two symmetrical longitudinal halves. This, however, is a matter of design. The longitudinal planar axis 24 may be askew from the center of the probing tip.

The test probe tip 20 shown in FIGS. 2–6 is shown as having two planar contact surfaces 40, 42. A first planar contact surface 40 extends from the longitudinal planar axis 24 at the tip end 26 to the exterior surface 34 between the tip end 26 and the base end 28. A second planar contact surface 42 extending from the longitudinal planar axis 24 at the tip end 26 to the exterior surface 34 between the tip end 26 and the base end 28. If the longitudinal planar axis 24 were askew, the two planar contact surfaces 40, 42 would not be symmetrical. Also, alternate preferred embodiments of the invention could have no planar contact surfaces (a hollow tube such as that shown in FIG. 7), one planar contact surface (such as if only one planar removal 82 was made from the blank 80), or more than two planar contact surfaces. The number of planar contact surfaces would depend on the intended use of the probing tip as well as cost considerations.

It should be noted that the contact surfaces 40, 42 may be, for example, smooth, rough, convex, concave, or stepped. It should be noted that, in addition to a smooth, regular surface, the planar contact surfaces 40, 42, could include irregularities such as one or more dimples, bumps, grooves, cavities, pits, openings, or other surface irregularities.

The notched electrical test probe tip 20 of the present invention preferably has an electrically conductive interior 56 for conducting electricity from the tip end 26 to the base end 28. The electrically conductive interior 56 may be brass, steel, gold plated titanium, or any other conductive material.

In one preferred embodiment, nonconductive material or insulation 58 at least partially surrounds the exterior surface 34. The insulation 58 on the exterior surface 34 helps to prevent short circuits. The planar contact surfaces 40, 42 are preferably exposed so that they can provide an electrically conductive surface. Depending on the method of construction, the interior surface of the notch 50 may or may not have insulation thereon. The insulation 58 may be plastic, rubber, ceramic, paint, hard coat, chromate, or any other nonconductive material.

The probing tip 22 has a central bore 60 defined therein that is substantially parallel to the longitudinal planar axis 24 and extends at least partially from the tip end 26 to the base end 28. Although the central bore 60 is shown as being longitudinally centered, alternative embodiments could have an askew central bore 60.

Figure 4:
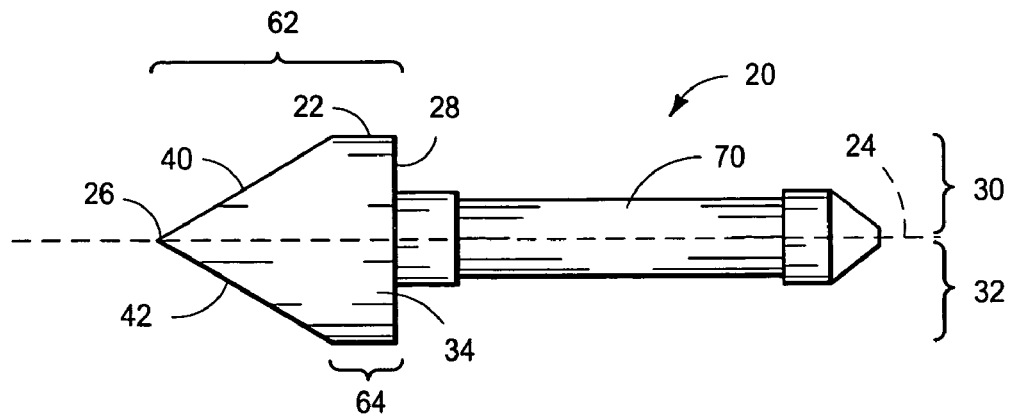
FIG. 4 is a side view of the notched electrical test probe tip of FIG. 2, the opposite side view being a mirror image thereof.
Figure 5:
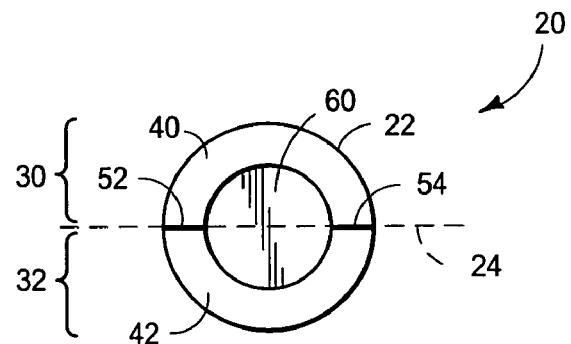
FIG. 5 is a top view of the notched electrical test probe tip of FIG. 2.
Figure 6:
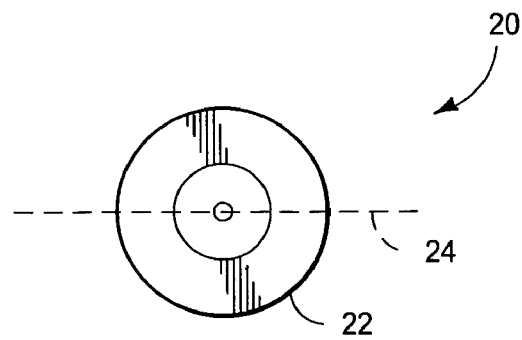
FIG. 6 is a bottom view of the notched electrical test probe tip of FIG. 2.

As shown in FIG. 4, the probing tip 20 has a maximum length 62 measured from the longitudinal planar axis 24 at the tip end 26 to the longitudinal planar axis 24 at the base end 28. FIG. 4 also shows that the probing tip 20 has a minimum length 64 measured from the exterior surface 34 between the tip end 26 and the base end 28 to the exterior surface 34 at the base end 28. In one preferred embodiment, at least one conductive surface 40 substantially descends from the maximum length 62 to the minimum length 64.

The shown preferred embodiment is cylindrical in shape and has a cylindrical central bore 60, however, alternative shapes are possible. For example, the probing tip 20 may be square in cross section or have some other geometry. Similarly, the central bore 60 may have an alternative geometry.

The exemplary embodiment of the notched electrical test probe tip 20 shown in FIGS. 2–6 includes a connector base 70. The base end 28 of the probing tip 22 is attached to the connector base 70 which may be coupled to the test probe or otherwise directly or indirectly to a testing instrument. The shown connector base 70 is an elongate member having a circular cross-section. In alternative preferred embodiments, the connector base 70 may have a cross-section of an alternate geometry. The connector base 70 may be integral to the probing tip 22 or it may be fastened to the base end 28 using any of a variety of known methods. The shown connector base 70 is meant to be exemplary and may be replaced with any type of connector adapted to mate with an electrical test probe 29.

FIGS. 2–6 are enlarged for emphasis and the dimensions are exemplary as they could be scaled to probe components of any size. However, in one preferred embodiment, the probing head 22 is approximately 0.250 inch in length and 0.060 inch in diameter. The central bore 60 has a diameter of approximately 0.033 inch. The angle of the planar contact surfaces 40, 42 are shown as approximately 30 degrees. The connector base 70 is approximately 0.150 inch long.

Methods for making the notched electrical test probe tip are also contemplated in the present invention. Specifically, a method of fabricating a notched electrical test probe tip 20 includes the steps of providing a blank 80 such as that shown in FIG. 7. The blank 80 may come pre-drilled or a central bore 60 extending at least partially from the tip end 26 to the base end 28 may be drilled into the blank 80. The blank 80 may come pre-coated with insulation 58 or may be coated with insulation 58. At some point, at least one portion of the blank 80 is removed to expose at least one contact surface.

FIG. 8 shows two exemplary planar removals 82, 84 that could be made to form a probing tip similar to that shown in FIGS. 2–6. Specifically, both planar removals 82, 84 start from the longitudinal planar axis 24 at the tip end 26 and extend to an exterior surface 34 of the blank 80 between the tip end 26 and the base end 28 to expose a contact surface.

In one embodiment, the step of coating the exterior surface 34 of the blank 80 with insulation 58 may be done prior to the step of drilling a central bore 60. In an alternate embodiment, the step of coating the exterior surface 34 of the blank 80 with insulation 58 may be done subsequent to the step of drilling a central bore 60, but prior to the step of removing the portions of the blank. In still another alternate embodiment, the step of coating may be done after the portions of the blank have been removed but, if this method is chosen, an additional step of removing the insulation 58 from the contact surfaces 40, 42 would probably be needed. Finally, it should be noted that if insulation 58 were not desired there would be no coating step.

The coating step, if done, could be done in any of a variety of ways including, but not limited to, dipping, spraying, brushing, dip spin, or any other coating process. It may also be done at several points in the chronological process.

The step of removing the at least one portion of the blank 80 may be done by machining, grinding, filing, or any other removal method.

When attached to a test probe the notched electrical test probe tip 20 can be brought into contact with circuit board components 90 without slipping as illustrated by FIGS. 9–11. In any of the methods discussed below, if slippage were to occur, the insulated surfaces of several of the preferred embodiments limit the chances of a short circuit occurring.

FIG. 9 shows one preferred sliding method of using the notched electrical test probe tip 20. In this method the user places a first planar contact surface 40 directly on the circuit board 92 so that the probing tip 22 is completely supported. Then the user slides the stabilized probing tip 22 into contact with the component. This method is unique among known tips.

FIG. 10 shows an alternate preferred perpendicular method of using the notched electrical test probe tip 20. In this method, the user places the interior surface of the two contact points 52, 54 on both sides of the component 90. This method is particularly suited to tight spaces or when the probing tip 22 has been specifically designed to fit on both sides of the component 90. Alternatively, the notched electrical test probe tip 20 could come in parallel to the circuit board 92 as it makes a connection with the component 90.

FIG. 11 shows an alternate preferred angled method of using the notched electrical test probe tip 20. In this method the user places any conductive surface (including the interior of the notch 50) against the component 90. This method shows the versatility of the probing tip 22 of the present invention. Depending on the embodiment, there are significant conductive surfaces, but the insulated exterior surface 34 protects against short circuits.

It should be noted that relational terms such as "front" and "back" are used for descriptive purposes and are not meant to limit the scope of the invention.

The terms and expressions that have been employed in the foregoing specification are used as terms of description and not of limitation, and are not intended to exclude equivalents of the features shown and described or portions of them. The scope of the invention is defined and limited only by the claims that follow.

What is claimed is:

1. A method of fabricating a notched electrical test probe tip, said method comprising the steps of:
   (a) providing an elongate electrically conductive blank having a longitudinal planar axis, an extreme first end of said blank, and a second end of said blank opposite said first end;
   (b) drilling a central bore substantially parallel to said longitudinal planar axis, said central bore extending at least partially from said first end to said second end; and
   (c) removing at least one portion of said blank from said longitudinal planar axis at said first end to an exterior surface of said blank between said first end and said second end to expose a contact surface having a notch defined therein.

2. The method of claim 1, said method further comprising the step of coating said exterior surface of said blank with insulation prior to said step of drilling a central bore.

3. The method of claim 1, said step of providing an elongate electrically conductive blank further comprising the step of providing an elongate electrically conductive blank with an insulated annular exterior surface.

4. The method of claim 1, said step of removing at least one portion of said blank further comprising the steps of:
   (a) removing a first portion of said blank from said longitudinal planar axis at said first end to an exterior surface of said blank between said first end and said second end to expose a first contact surface; and
   (b) removing a second portion of said blank from said longitudinal planar axis at said first end to an exterior surface of said blank between said first end and said second end to expose a second contact surface, said first and second contact surfaces substantially forming an inverted "V."

5. The method of claim 1, further comprising the step of making a planar cut from said longitudinal planar axis at said first end to said exterior surface of said blank between said first end and said second end.

6. The method of claim 1, further comprising the step of making a planar cut from said longitudinal planar axis at said first end to said exterior surface of said blank between said first end and said second end, said planar cut intersecting said central bore.

7. The method of claim 1, further comprising the step of exposing at least one conductive surface substantially descending from said first end to said exterior surface of said blank between said first end and said second end.

8. A method of fabricating a notched electrical test probe tip, said method comprising the steps of:
(a) providing an elongate electrically conductive blank having a longitudinal planar axis, an extreme first end of said blank, and a second end of said blank opposite said first end;
(b) drilling a central bore substantially parallel to said longitudinal planar axis, said central bore extending at least partially from said first end to said second end;
(c) making a planar cut from said longitudinal planar axis at said first end to said exterior surface of said blank between said first end and said second end; and
(d) exposing a contact surface along said planar cut, said contact surface having a notch defined therein.

9. The method of claim 8, said method further comprising the step of coating said exterior surface of said blank with insulation prior to said step of drilling a central bore.

10. The method of claim 8, said step of providing an elongate electrically conductive blank further comprising the step of providing an elongate electrically conductive blank with an insulated annular exterior surface.

11. The method of claim 8, said step of removing at least one portion of said blank further comprising the steps of:
(a) removing a first portion of said blank from said longitudinal planar axis at said first end to an exterior surface of said blank between said first end and said second end to expose a first contact surface; and
(b) removing a second portion of said blank from said longitudinal planar axis at said first end to an exterior surface of said blank between said first end and said second end to expose a second contact surface, said first and second contact surfaces substantially forming an inverted "V."

12. The method of claim 8, wherein said step of making a planar cut further comprises the step of making a planar cut intersecting said central bore.

13. The method of claim 8, wherein said step of exposing a contact surface further comprises the step of exposing at least one conductive surface substantially descending from said first end to said exterior surface of said blank between said first end and said second end.

14. A method of fabricating a notched electrical test probe tip, said method comprising the steps of:
(a) providing an elongate electrically conductive blank having a longitudinal planar axis, an extreme first end of said blank, and a second end of said blank opposite said first end;
(b) drilling a central bore substantially parallel to said longitudinal planar axis, said central bore extending at least partially from said first end to said second end; and
(c) exposing at least one conductive surface substantially descending from said first end to an exterior surface of said blank between said first end and said second end, said contact surface having a notch defined therein.

15. The method of claim 14, said method further comprising the step of coating said exterior surface of said blank with insulation prior to said step of drilling a central bore.

16. The method of claim 14, said step of providing an elongate electrically conductive blank further comprising the step of providing an elongate electrically conductive blank with an insulated annular exterior surface.

17. The method of claim 14, said step of removing at least one portion of said blank further comprising the steps of:
(a) removing a first portion of said blank from said longitudinal planar axis at said first end to an exterior surface of said blank between said first end and said second end to expose a first contact surface; and
(b) removing a second portion of said blank from said longitudinal planar axis at said first end to an exterior surface of said blank between said first end and said second end to expose a second contact surface, said first and second contact surfaces substantially forming an inverted "V."

18. The method of claim 14, further comprising the step of making a planar cut from said longitudinal planar axis at said first end to said exterior surface of said blank between said first end and said second end.

19. The method of claim 14, further comprising the step of making a planar cut from said longitudinal planar axis at said first end to said exterior surface of said blank between said first end and said second end, said planar cut intersecting said central bore.

20. The method of claim 14, further comprising the step of removing at least one portion of said blank from said longitudinal planar axis at said first end to said exterior surface of said blank between said first end and said second end to expose a contact surface.

* * * * *